(12) United States Patent
Lewis

(10) Patent No.: US 7,170,013 B2
(45) Date of Patent: Jan. 30, 2007

(54) SPRING FINGERS WITH END EXTENSIONS

(75) Inventor: Jeffrey M. Lewis, Maynard, MA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 3 days.

(21) Appl. No.: 11/032,991

(22) Filed: Jan. 10, 2005

(65) Prior Publication Data

US 2005/0225958 A1 Oct. 13, 2005

Related U.S. Application Data

(60) Provisional application No. 60/560,542, filed on Apr. 8, 2004.

(51) Int. Cl.
*H05K 9/00* (2006.01)

(52) U.S. Cl. ............... 174/354; 174/355; 361/800

(58) Field of Classification Search ............. 174/35 R, 174/35 GC, 354, 355; 277/920; 361/800
See application file for complete search history.

(56) References Cited

U.S. PATENT DOCUMENTS

| | | | |
|---|---|---|---|
| 4,780,570 A | 10/1988 | Chuck | |
| 4,874,337 A | 10/1989 | Paukovits, Jr. et al. | |
| 5,043,528 A | 8/1991 | Mohr | |
| 5,052,948 A | 10/1991 | Hyzin | |
| 5,151,054 A | 9/1992 | Briones et al. | |
| 5,313,016 A | 5/1994 | Brusati et al. | |
| 5,534,662 A | 7/1996 | Peacock et al. | |
| 5,783,771 A | 7/1998 | Copeland et al. | |
| 6,140,577 A | 10/2000 | Rapaich et al. | |
| 6,225,555 B1 | 5/2001 | Sosnowski | |
| 6,283,770 B1 | 9/2001 | Leung et al. | |
| 6,320,120 B1 | 11/2001 | Van Haaster | |
| 6,414,851 B2 | 7/2002 | Cherniski et al. | |
| 6,416,361 B1 | 7/2002 | Hwang | |
| 6,483,023 B1 | 11/2002 | Jacques | |
| 6,493,241 B1 | 12/2002 | Horng | |
| 6,534,706 B1 | 3/2003 | Rapp et al. | |
| 6,537,084 B2 | 3/2003 | Casey et al. | |
| 6,544,047 B2 | 4/2003 | Moore | |
| 6,580,028 B1 | 6/2003 | Mellberg et al. | |
| 6,607,308 B2 | 8/2003 | Dair et al. | |
| 6,946,598 B1* | 9/2005 | Konshak ............... 174/35 GC |
| 2003/0015331 A1 | 1/2003 | Ferland et al. | |
| 2003/0029626 A1 | 2/2003 | Liao et al. | |
| 2003/0051891 A1 | 3/2003 | Rapp et al. | |
| 2003/0116337 A1 | 6/2003 | Thompson et al. | |
| 2003/0121688 A1 | 7/2003 | Thompson et al. | |
| 2003/0141090 A1 | 7/2003 | Kruger et al. | |

FOREIGN PATENT DOCUMENTS

JP 11-307977 * 11/1999

* cited by examiner

*Primary Examiner*—Hung V. Ngo

(57) ABSTRACT

In various embodiments, an electromagnetic shielding apparatus and method is provided. In one representative embodiment, an electromagnetic shielding apparatus is provided that comprises a plurality of spring fingers ganged together. At least one of the spring fingers includes an end extension adapted to facilitate a corner-to-corner contact with a mounting slot in a panel.

24 Claims, 6 Drawing Sheets

SPRING FINGERS WITH END EXTENSIONS

CROSS REFERENCE TO RELATED APPLICATIONS

The present Patent Application claims priority to U.S. Provisional Patent Application entitled "Spring Fingers with End Extensions", filed on Apr. 8, 2004, and assigned Application No. 60/560,542.

BACKGROUND

Many electronic products such as computers, displays, servers, and other products produce electromagnetic radiation that is contained using an electromagnetic shield such as a Faraday cage. In some cases, such products may be disposed within enclosures that include one or more panels that mate together to form the Faraday cage. In some situations, such panels are removable. Unfortunately, when two panels mate in a given enclosure, a seam is created between the two panels. Such a seam presents a gap that allows unacceptable electromagnetic radiation to escape the enclosure.

BRIEF DESCRIPTION OF THE DRAWINGS

The invention can be understood with reference to the following drawings. The components in the drawings are not necessarily to scale. Also, in the drawings, like reference numerals designate corresponding parts throughout the several views.

DETAILED DESCRIPTION

Figures 1A, 1B:
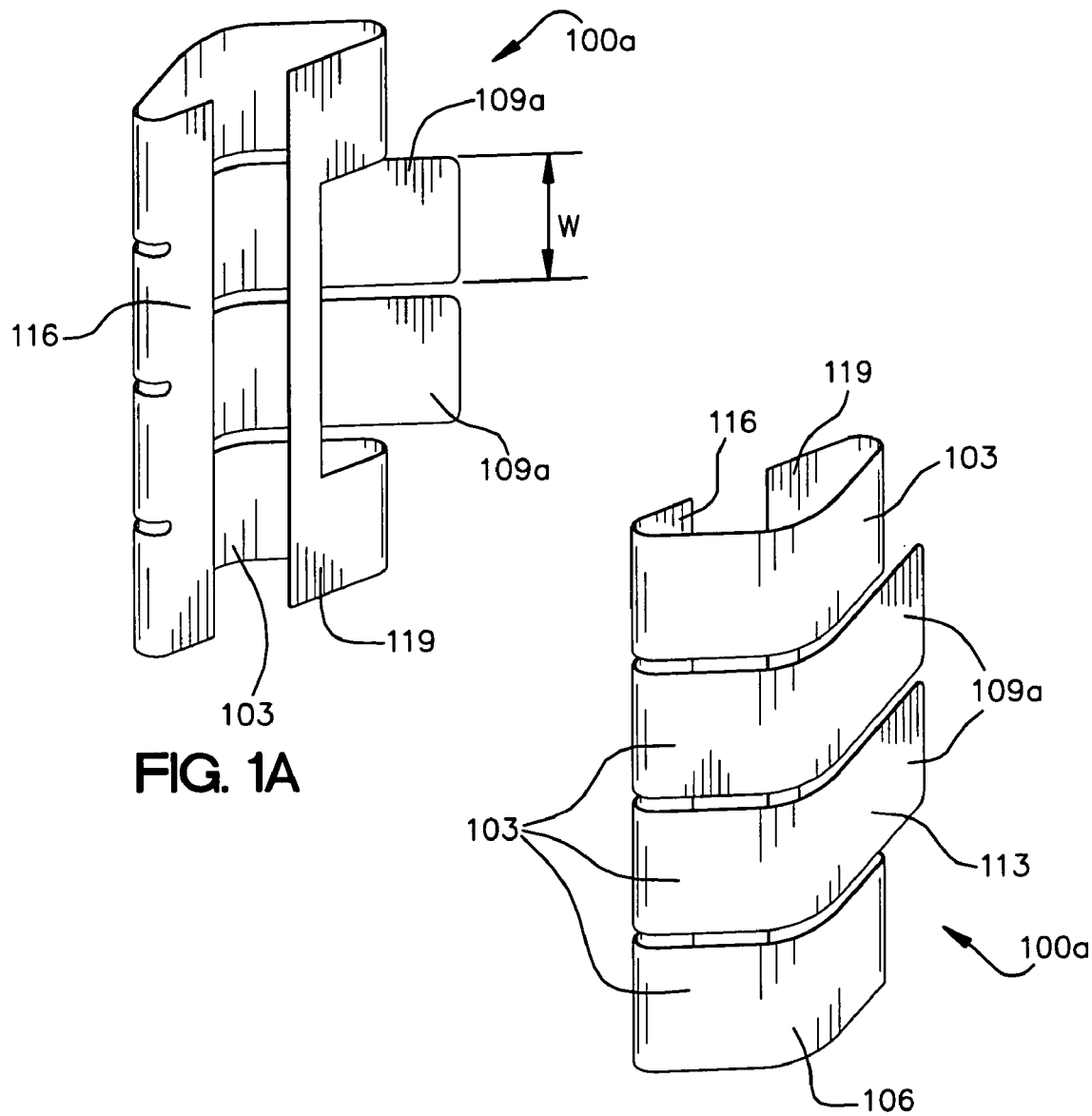
FIGS. 1A and 1B are front and rear perspective views of ganged spring fingers with full width extensions according to an embodiment of the present invention.

FIGS. 1A and 1B show perspective views of a front and back of a spring finger assembly 100a according to an embodiment of the present invention. The spring finger assembly 100a is employed at a junction between adjacent panels to provide electro-magnetic shielding. Specifically, assuming that adjacent panels form or partially form an enclosure that houses electronic circuitry or other equipment that emits electromagnetic radiation, then the junction of such adjacent panels might present an opening for the emission of electromagnetic radiation. As the frequency of the electromagnetic radiation increases, its wavelength decreases proportionally. Consequently, as the frequency of electromagnetic radiation increases, the radiation leaks through smaller holes or seams in the enclosure itself.

Various embodiments of the present invention provide for spring finger assemblies 100 that serve the purpose of electrically closing the gap or seam between adjacent panels of an electromagnetic shield enclosure. In order to facilitate the installation of the spring finger assemblies 100 in a panel of an enclosure, mounting slots may be created in the panels themselves. If the frequency of the electromagnetic radiation within the enclosure is relatively high, mounting slots that fall on an exterior side of conventional spring fingers can enable the electromagnetic radiation to escape. Accordingly, spring finger assemblies 100 according to the various embodiments of the present invention provide for the closing of any gap presented by an exterior mounting slot as will be described.

FIG. 1 shows a spring finger assembly 100a that includes a plurality of spring fingers 103 that are connected or "ganged" together. Each of the spring fingers 103 includes an independent spring portion 106. The independent spring portion 106 of each of the spring fingers 103 are "independent" in that independent spring portion 106 of each sprint finger 103 are the portions that provide a spring force when compressed without resulting in the compression of the independent spring portions 106 of adjacent spring fingers 103. In this respect, the independent spring portions 106 of each of the spring fingers 103 are not connected to each other. Specifically, a gap exists between independent spring portions 106 of adjacent ones of the spring fingers 103. That is to say, there is no structural bridging between the independent spring portions 106 of any two adjacent spring fingers 103.

As shown, two of the spring fingers 103 include an end extension 109a according to an embodiment of the present invention. As shown, two of the spring fingers 103 include end extensions 109a according to one embodiment. The end extensions 109a provide or facilitate corner-to-corner contact with corners of a mounting slot in a panel within which the spring finger assembly 100a is mounted. More or less spring fingers 103 having an end extension 109a may be included within the spring finger assembly 100a.

The end extensions 109a generally extend straight from one side 113 of a respective finger 103 and are in alignment with the side 113 of a respective spring finger 103 from which the end extension 109a protrude. Alternatively, the end extensions 109a may be curved or embody a profile of some other shape. In any event, the side profile or shape of the end extensions 109a facilitate the corner-to-corner contact that closes the gap presented by an external mounting slot. Each of the end extensions 109a includes a width W that is equal to the width of the corresponding spring fingers 103 from which the end extensions 109a extend. Alternatively, the end extensions 109a may be greater in width than the spring fingers 103. As an additional alternative, the end extensions may have a width that is less than the width of the spring fingers 103.

As shown, the end extensions 109a are disposed on intermediate ones of the spring fingers 103. Specifically, the intermediate ones of the spring fingers 103 are between spring fingers 103 located on the ends of the spring finger assembly 100a. As shown, the width of the intermediate ones of the spring fingers 103 is generally equal to the width of the end ones of the spring fingers 103. However, as an alternative, the width of the intermediate ones of the spring fingers 103 may be greater or less than the width of the end ones of the spring fingers 103.

The spring fingers 103 are connected or ganged together by a retaining member or flap 116. In this respect, a single end of each of the spring fingers 103 terminates into the retaining member or flap 116 as shown. Similarly, an opposite end of at least two of the spring fingers 103 terminates into a second retaining flap 119. While only two of the spring fingers 103 are coupled to the second retaining flap 119, more or less spring fingers 103 than the two shown can be coupled to the second retaining flap 119.

Since the spring fingers 103 are ganged together by the retaining flap 116, the spring fingers 103 are easily mounted into mounting slots of a panel. Multiple spring fingers 103 may be simultaneously assembled into the mounting slots of a panel as a single spring finger assembly 100a. Thus, each spring finger does not need to be individually mounted into a mounting slot. In this respect, assembly of the spring fingers 103 that make up the spring finger assembly 100a in a panel is more efficient, and assembly cost is correspondingly reduced. The retaining flap 116 and second retaining flap 119 are labeled "retaining" flaps as they allow the spring finger assembly 100a to be attached, coupled, or clamped onto mounting slots of a panel.

Figure 2:
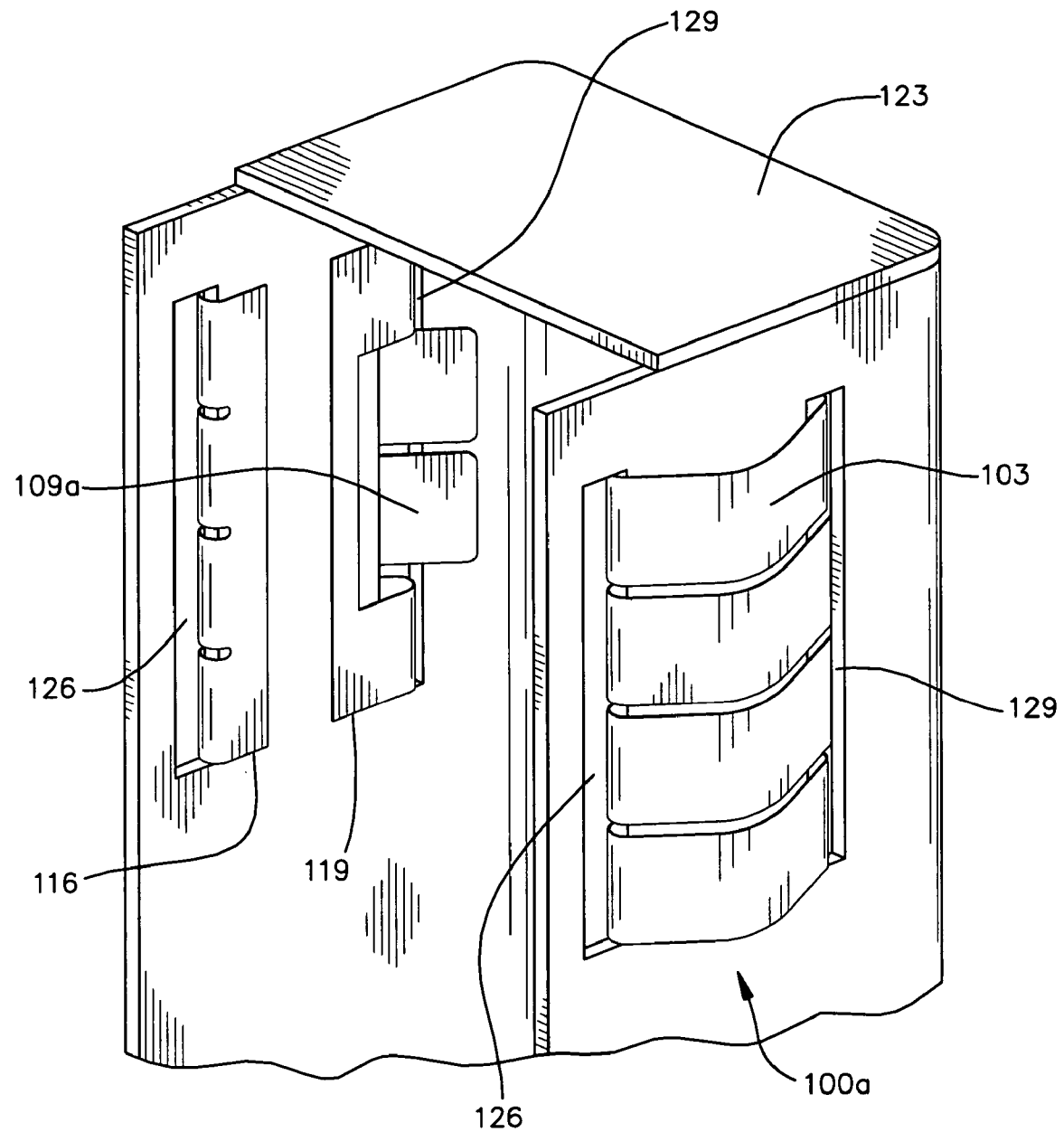
FIG. 2 is a perspective view of the ganged spring fingers of FIGS. 1A and 1B as installed in mounting slots of a panel according to an embodiment of the present invention.

FIG. 2 shows a perspective view of a panel 123 with the spring finger assemblies 100a installed therein according to an embodiment of the present invention. The panel is part of an electromagnetic shield. The panel 123 includes interior mounting slots 126 and exterior mounting slots 129. As shown, the retaining flap 116 and second retaining flap 119 of each of the spring finger assemblies 100a grip the panel 123 through the interior and exterior mounting slots 126 and 129. Also, the end extensions 109a partially close a gap presented by the exterior mounting slots 129. Specifically, the end extensions 109a come into contact with a pair of diagonally opposite corners of the exterior mounting slots 129. In this respect, the end extensions 109a project through the exterior mounting slots 129.

As mentioned above, the width of the intermediate ones of the spring fingers 103 may be greater or less than the width of the end ones of the spring fingers 103 as will be described. For example, in one embodiment, the width of the intermediate ones of the spring fingers 103 is greater than the width of the end ones of the spring fingers 103. Also, the end extensions 109a are disposed on the intermediate ones of the spring fingers 103. In such case, a greater portion of the gap formed by the exterior mounting slot 129 in the panel 123 into which the spring finger assembly 100a is mounted is closed. As a result, a lesser amount of electro-magnetic radiation can escape through the exterior mounting slot 129.

Figure 3A:
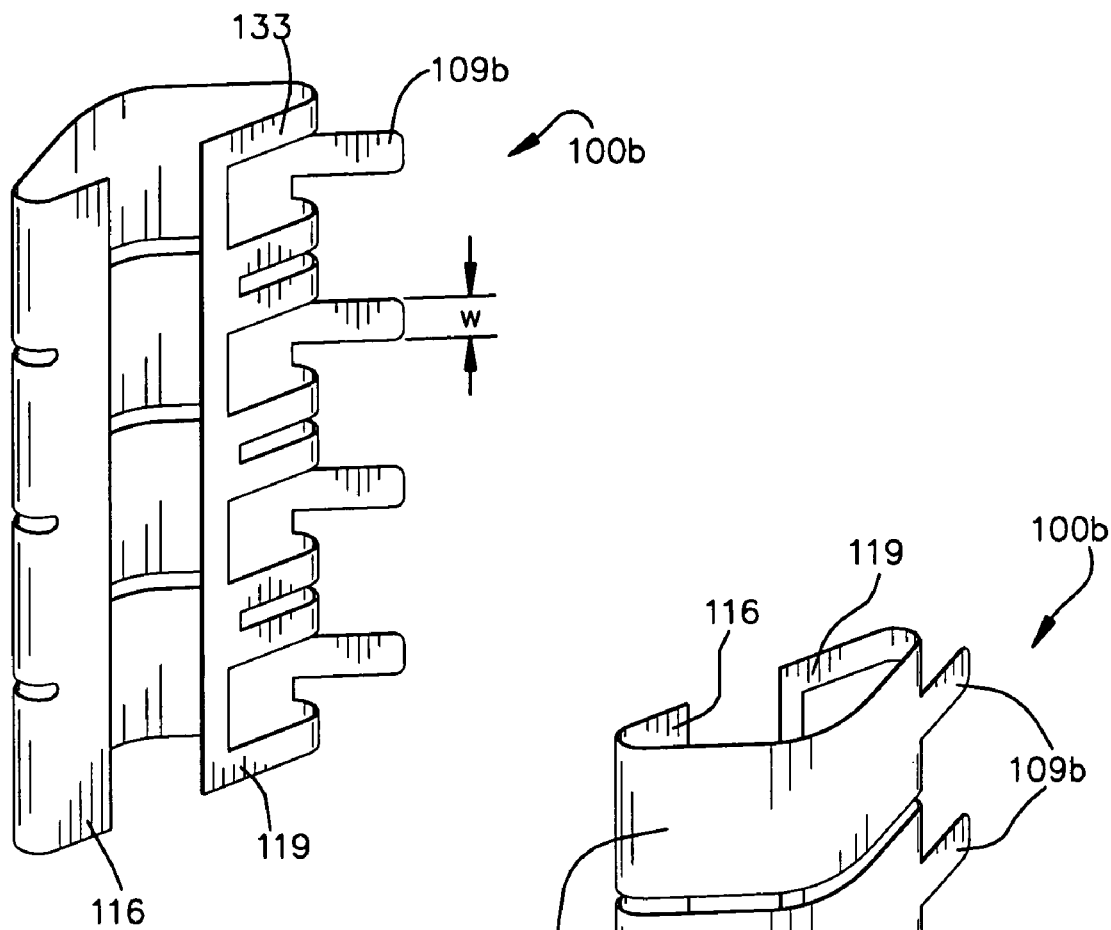
FIGS. 3A and 3B are front and rear perspective views of ganged spring fingers with partial width extensions according to an embodiment of the present invention.
Figure 3B:
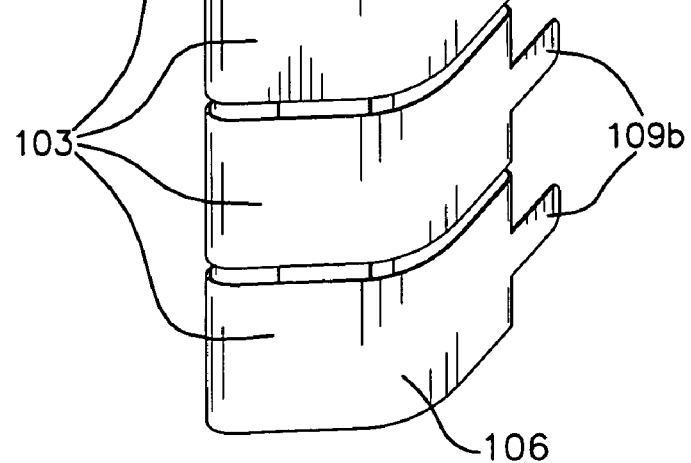

FIGS. 3A and 3B show a second spring finger assembly 100b according to another embodiment of the present invention. The spring finger assembly 100b also includes a plurality of spring fingers 103 that are connected or ganged together. Each of the spring fingers 103 of the spring finger assembly 100b also includes an independent spring portion 106.

The spring finger assembly 100b includes end extensions 109b according to an embodiment of the present invention. As shown, all of the spring fingers 103 of the spring finger assembly 100b include end extensions 109b. In other embodiments, one or more of the spring fingers 103 may not include an end extension 109b. The end extensions 109b facilitate corner-to-corner contact with corners of a mounting slot in a panel within which the spring finger assembly 100b is mounted. The end extensions 109b have a width W that is less than a width of the corresponding spring fingers 103 from which they extend.

The spring fingers 103 are connected or ganged together by the retaining flap 116 and the second retaining flap 119. In this respect, a single end of each of the spring fingers 103 terminates into the retaining flap 116. Also, each of the spring fingers 103 is coupled to the secondary retaining flap 119 by at least one connection segment 133.

As shown, the width of the intermediate ones of the spring fingers 103 is generally equal to the width of the end ones of the spring fingers 103. However, as an alternative, the width of any of the spring fingers 103 may vary with respect to each other. Also, the widths of the end extensions 109b may correspondingly vary with respect to each other.

In an alternative embodiment, a spring finger assembly 100 may be created that is a hybrid of the spring finger assembly 100a (FIG. 1A) and the spring finger assembly 100b (FIG. 3A). In this alternative embodiment, various ones of the end extensions include a width as great as the spring fingers 103, and some of the end extensions 109b include a width that is less than the width of the spring fingers 103. Also, such hybrid spring finger assemblies may include end extensions 109b with a width that is greater than the width of the spring fingers 103.

Since the spring fingers 103 are ganged together by the retaining flaps 116 and 119, the spring fingers 103 are easily installed into mounting slots of a panel for the same reasons as discussed above with reference to the spring finger assembly 100a.

Figure 4:
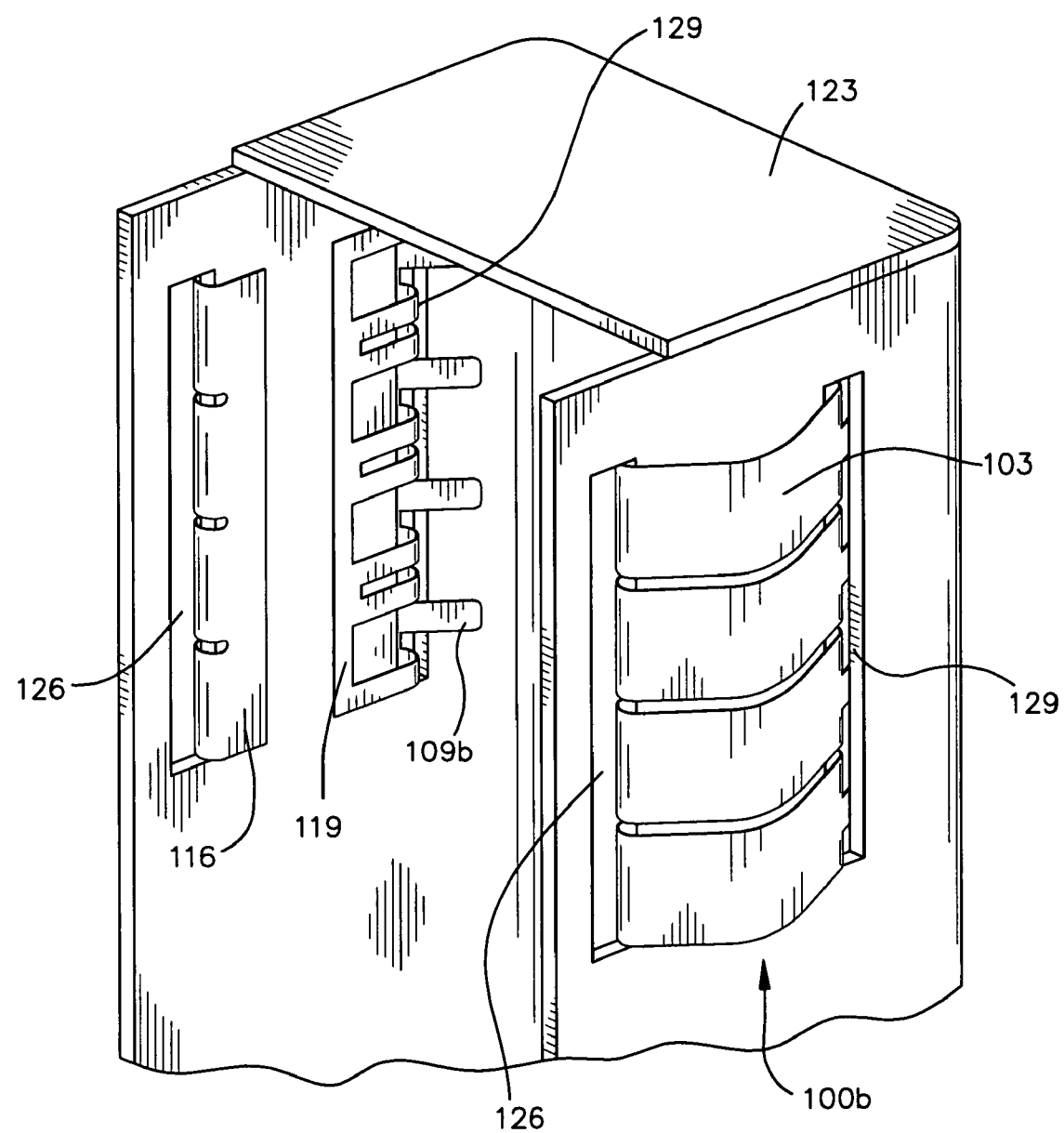
FIG. 4 is a perspective view of the ganged spring fingers of FIGS. 3A and 3B as installed in mounting slots of a panel according to an embodiment of the present invention.

FIG. 4 shows a perspective view of a panel 123 with the spring finger assemblies 100b installed therein according to an embodiment of the present invention. The panel 123 forms part of an electro-magnetic enclosure (not shown). As was described previously, the panel 123 includes the interior mounting slots 126 and the exterior mounting slots 129. When installed, the retaining flap 116 and the secondary retaining flap 119 grasp the portion of the panel 123 between the interior mounting slots 126 and the exterior mounting slots 129. The end extensions 109b project through the exterior mounting slots 129 and ultimately facilitate the closure of portions of the exterior mounting slots 129 to prevent unwanted electromagnetic radiation.

The end extensions 109b may be straight and in alignment with at least one side of a respective spring finger 103, or the end extensions 109b may be curved or embody a profile of some other shape. In any event, the side profile or shape of the end extensions 109b facilitate the corner-to-corner contact that closes the gap presented by an external mounting slot.

Figure 5:
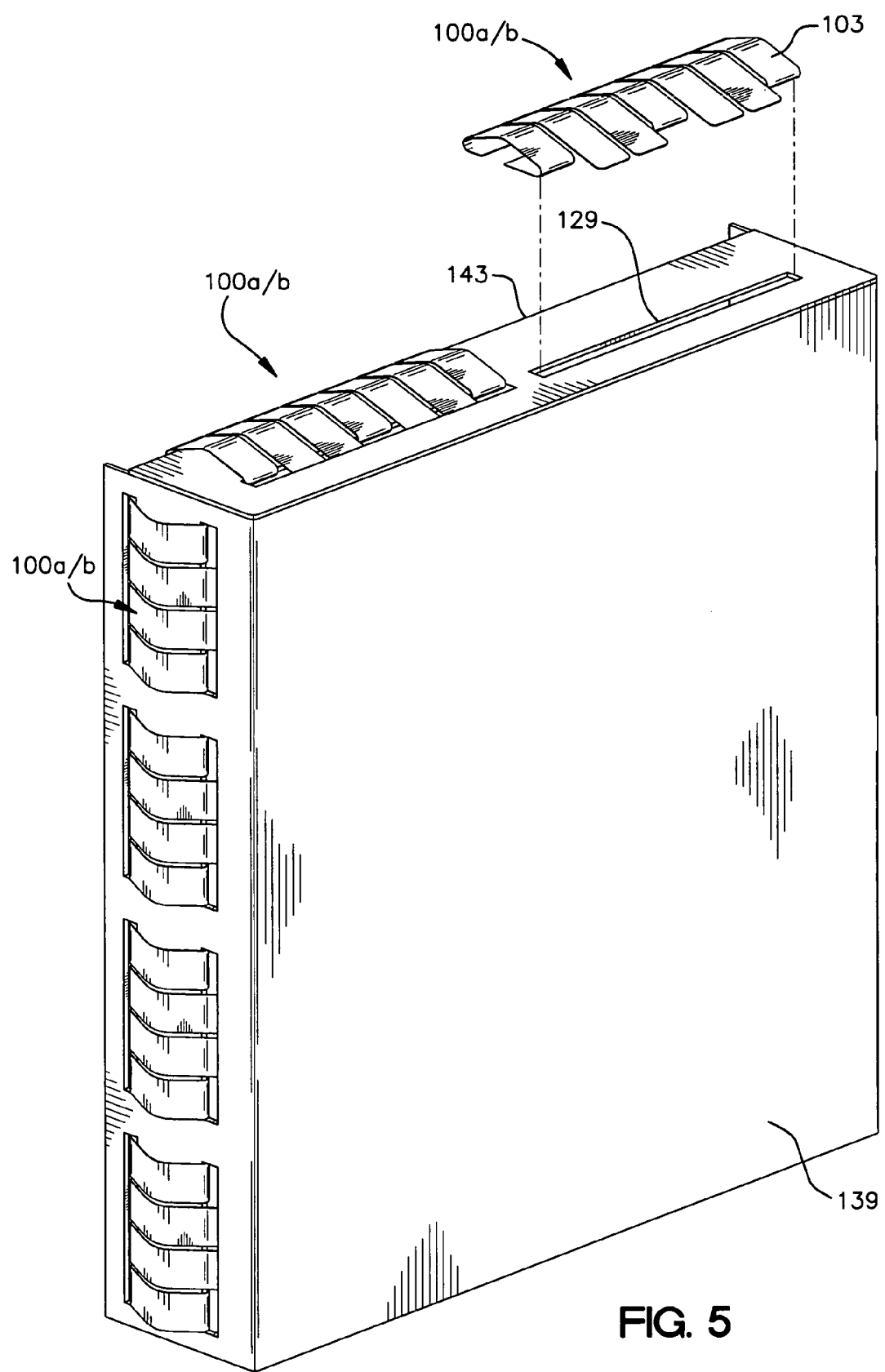
FIG. 5 is a perspective view of a panel with a plurality of ganged spring fingers of FIGS. 1A and 1B installed therein according to an embodiment of the present invention.

FIG. 5 show is a perspective view of a panel 139 into which is installed a plurality of spring finger assemblies 100a according to an embodiment of the present invention. As shown, the panel 139 includes exterior mounting slots 129 and an interior mounting edge 143. In this respect, the spring finger assemblies 100a/b are mounted on the exterior mounting slot 129 and the interior mounting edge 143 instead of employing an interior mounting slot 126 as was described with reference to FIGS. 2 and 4. In addition, as depicted, the spring finger assemblies 100a/b include more than four spring fingers 103 as described with reference to FIGS. 1A, 1B, 3A, and 3B. In this respect, any number of spring fingers 103 may be ganged together in a single spring finger assembly 100a or 100b as desired.

Figure 6:
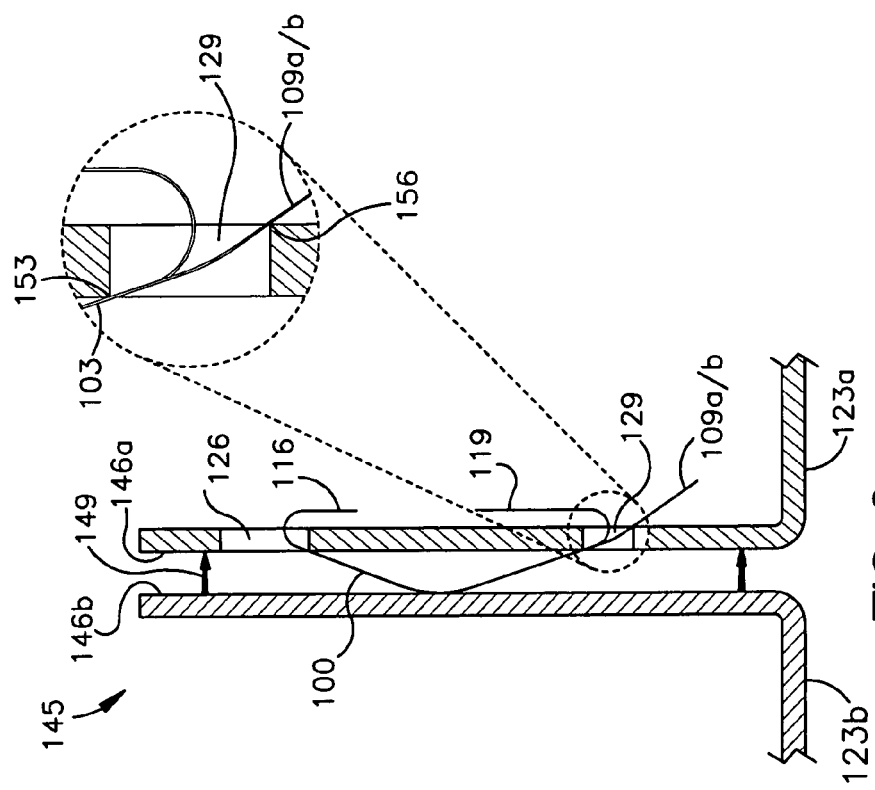
FIG. 6 is a side cutaway view of a junction between a pair of mated panels with a spring finger of FIG. 1A or 3A compressed within a slot formed between the mated panels according to an embodiment of the present invention.

FIG. 6, shows is a side cut out view of a junction 145 between a first panel 123a and a second panel 123b that illustrates the operation of the spring finger assemblies 100a (FIG. 1A) or 100b (FIG. 3B). The panel 123a includes the interior mounting slot 126 and the exterior mounting slot 129. Alternatively, the panel 123a may include the interior mounting edge 143 (FIG. 5). The panels 123a and 123b each include a mating face 146 that are denoted herein as first mating face 146a and second mounting face 146b, respectively. A spring finger assembly 100a/b is mounted in the interior and exterior mounting slots 126 and 129 in the first mating face 146a of panel 123a. The first and second panels 123a and 123b may be coupled together using an appropriate fastener (not shown) such as, for example, a screw, bolt, buckle, or other appropriate fastener as can be appreciated by those with ordinary skill in the art.

Since the first panel 123a is fastened to the second panel 123b and creates junction 145, a compressive force 149 is generated between the first and second mounting faces 146a and 146b. As a result, the spring fingers of the spring finger assembly 100 are compressed.

The end extension 109 projects through the mounting slot 129 and facilitates electrical contact of the respective spring finger 103 with a pair of diagonally opposing corners of the mounting slot 129. Specifically, the corner 153 contacts a portion of the spring finger 103 and the corner 156 contacts the end extension 109. Alternatively, the spring finger 103 and the end extension 109 may be configured so that the end extension 109 contacts both corners 153 and 156.

In any event, due to the end extensions 109, the exterior mounting slot 129 is partially closed due to the corner-to-corner contact made by the spring finger 103/end extension 109. In this manner, the opening created by the exterior mounting slot 129 is reduced. This reduction provides for greater electromagnetic shielding and a more effective Faraday cage surrounding the electronic apparatus contained within an enclosure that includes the panels 123a and 123b. Consequently, higher frequency devices may operate within the confines of the enclosure that includes the panels 123a and 123b. This is because the gap created by the exterior mounting slot 129 when a spring finger assembly 100a/b is employed is reduced. As such, the exit of electromagnetic radiation of higher frequencies is inhibited. In addition, given that the spring finger assemblies 100a/b include a number of ganged together spring fingers 103, the time it takes to install the spring fingers associated with the spring finger assembly 100a/b into the panel 123a is significantly reduced. This reduction of time is determined in comparison to the time it would take to install the spring fingers 103 individually. Accordingly, manufacturing costs are reduced.

Figure 7B:
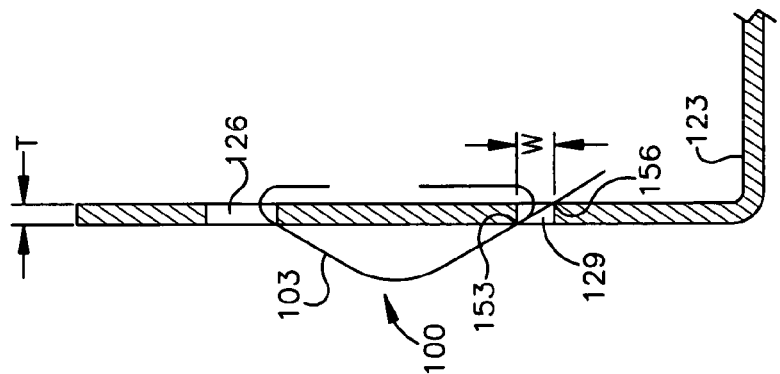
FIGS. 7A and 7B are side cutaway views of panels having a spring finger of FIG. 1A or 3A installed therein according to an embodiment of the present invention.
Figure 7A:
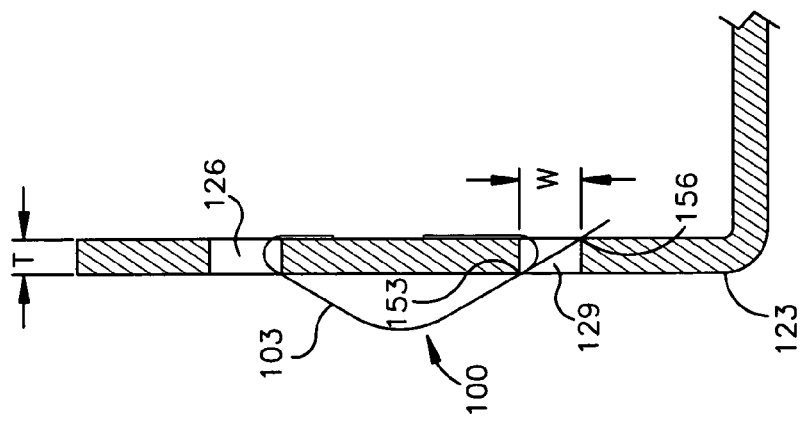

FIGS. 7A and 7B show side cut away views of a panel 123 that illustrates the respective sizes of the internal and external mounting slots 126 and 129 according to an embodiment of the present invention. In this respect, the exterior mounting slots 129 include a thickness T and a width W. The width W of the exterior mounting slot 129 is specified so as to enable the spring fingers and end extensions of a spring finger assembly 100 to contact the pair of diagonally opposing corners 153 and 156 of the exterior mounting slot 129 as described above. Due to the compression of the spring finger assembly 100 when the first and second panels 123 are placed together, the width and thickness of the exterior mounting slot 129 may vary significantly.

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. An electro-magnetic shielding apparatus, comprising:
   first and second retaining flaps for gripping a panel;
   a plurality of spring fingers ganged together between the first and second retaining flaps; and
   at least one of the spring fingers including an end extension connected to and extending outwardly from only one of the first and second retaining flaps and adapted to facilitate a corner-to-corner contact of diagonally opposite corners of a mounting slot in the panel.

2. The electro-magnetic shielding apparatus of claim 1, wherein each of the spring fingers includes an independent spring portion.

3. The electro-magnetic shielding apparatus of claim 2, wherein a width of the end extension is at least as great as a width of the at least one of the spring fingers.

4. The electro-magnetic shielding apparatus of claim 3, wherein the at least one of the spring fingers including the end extension is an intermediate one of the spring fingers.

5. The electro-magnetic shielding apparatus of claim 3, wherein the end extension is straight in alignment with at least one side of the independent spring portion of the at least one of the spring fingers.

6. The electro-magnetic shielding apparatus of claim 2, wherein a width of the end extension is less than a width of the at least one of the spring fingers.

7. The electro-magnetic shielding apparatus of claim 6, wherein the end extension is straight in alignment with at least one side of the independent spring portion of the at least one of the spring fingers.

8. The electro-magnetic shielding apparatus of claim 2, wherein the spring fingers further comprise:
   an end spring finger; and
   an intermediate spring finger, wherein the intermediate spring finger has a width that is greater than a width of the end spring finger.

9. The electro-magnetic shielding apparatus of claim 1, wherein a single end of at least two of the spring fingers terminates into only one of the first and second retaining flaps.

10. The electro-magnetic shielding apparatus of claim 1, wherein two of the spring fingers connect to both the first and second retaining flaps and two of the spring fingers connect to only the first retaining flap.

11. A method, comprising:
   retaining a plurality of spring fingers in a panel via a mounting slot, the spring fingers being connected together and extending between oppositely disposed first and second retaining flaps that grip the panel; and
   at least partially closing a gap presented by the mounting slot with an end extension of at least one of the spring fingers by extending the at least one of the spring fingers outwardly from one of the first and second retaining flaps to at least one of a pair of diagonally opposite corners of the mounting slot with the end extension.

12. The method of claim 11, wherein the at least partial closing of the gap presented by the mounting slot with the end extension of the at least one of the spring fingers further comprises at least partially closing the gap with the end extension having a width that is at least as great as a full width of the at least one of the spring fingers.

13. The method of claim 11, wherein the at least partial closing of the gap presented by the mounting slot with the end extension of the at least one of the spring fingers further comprises at least partially closing the gap with the end extension having a width that is less than a full width of the at least one of the spring fingers.

14. The method of claim 11, further comprising ganging the spring fingers together by terminating a single end of each of the spring fingers into the first retaining flap.

15. The method of claim 11, further comprising terminating a single end of at least two of the spring fingers into the first second retaining flap without connecting to the second retaining flap.

16. An electro-magnetic shielding apparatus, comprising:
a plurality of spring fingers extending between oppositely disposed first and second retaining flaps that grip a panel;
means for ganging each of the spring fingers together; and
extension means included in at least one of the spring fingers and extending outwardly from the first retaining flap for facilitating a corner-to-corner contact of diagonally opposite corners of a mounting slot in the panel.

17. The electro-magnetic shielding apparatus of claim 16, wherein the extension means further comprises an end extension, wherein a width of the end extension is at least as great as a width of the at least one of the spring fingers.

18. The electro-magnetic shielding apparatus of claim 16, wherein the extension means further comprises an end extension, wherein a width of the end extension is less than a width of the at least one of the spring fingers.

19. The electro-magnetic shielding apparatus of claim 16, wherein each of the spring fingers includes an independent spring portion.

20. The electro-magnetic shielding apparatus of claim 19, wherein a single end of two of the spring fingers terminates into the first retaining flap without connecting to the second retaining flap.

21. A system for electro-magnetic shielding, comprising:
a first panel having a first mating face, the first mating face having a mounting slot;
a plurality of spring fingers ganged together between first and second retaining flaps that grip the first mating face using the mounting slot;
a second panel having a second mating face, wherein the second mating face is positioned against the first mating face, the spring fingers being compressed between the first mating face and the second mating face; and
at least one of the spring fingers having an end extension that projects outwardly from the first retaining flap through the mounting slot to a location adjacent the second retaining flap, the end extension contacting at least one of a pair of diagonally opposing corners of the mounting slot, thereby partially closing the mounting slot.

22. The electro-magnetic shielding apparatus of claim 21, wherein each of the spring fingers includes an independent spring portion.

23. The electro-magnetic shielding apparatus of claim 22, wherein a width of the end extension is at least as great a width of the at least one of the spring fingers.

24. The electro-magnetic shielding apparatus of claim 22, wherein a width of the end extension is less than a width of the at least one of the spring fingers.

* * * * *

UNITED STATES PATENT AND TRADEMARK OFFICE
CERTIFICATE OF CORRECTION

PATENT NO. : 7,170,013 B2  
APPLICATION NO. : 11/032991  
DATED : January 30, 2007  
INVENTOR(S) : Jeffrey M. Lewis Page 1 of 1

It is certified that error appears in the above-identified patent and that said Letters Patent is hereby corrected as shown below:

In column 6, line 53, in Claim 11, after "flaps to" insert -- contact --.

In column 7, line 6, in Claim 15, after "first" insert -- and --.

In column 8, line 24, in Claim 23, after "great" insert -- as --.

Signed and Sealed this

Eleventh Day of August, 2009

David J. Kappos
*Director of the United States Patent and Trademark Office*